United States Patent
Hou et al.

(10) Patent No.: US 7,994,606 B2
(45) Date of Patent: Aug. 9, 2011

(54) DE-COUPLING CAPACITORS PRODUCED BY UTILIZING DUMMY CONDUCTIVE STRUCTURES INTEGRATED CIRCUITS

(75) Inventors: Cliff Hou, Taipei (TW); Lee-Chung Lu, Taipei (TW); Chia-Lin Cheng, Tao-Yuan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 16 days.

(21) Appl. No.: 12/410,117

(22) Filed: Mar. 24, 2009

(65) Prior Publication Data

US 2009/0180237 A1    Jul. 16, 2009

Related U.S. Application Data

(62) Division of application No. 11/650,028, filed on Jan. 5, 2007, now abandoned, which is a division of application No. 10/952,259, filed on Sep. 27, 2004, now Pat. No. 7,262,951.

(51) Int. Cl.
*H01L 21/70* (2006.01)

(52) U.S. Cl. .......................................... 257/508; 257/662

(58) Field of Classification Search .................. 257/508, 257/662
See application file for complete search history.

(56) References Cited

U.S. PATENT DOCUMENTS

| 5,610,403 | A  | * | 3/1997 | Kingsley et al. ......... 250/370.09 |
| 5,770,969 | A  |   | 6/1998 | Walls et al. |
| 6,388,200 | B2 |   | 5/2002 | Schaper |
| 6,452,778 | B1 |   | 9/2002 | Leung et al. |
| 6,888,235 | B2 |   | 5/2005 | Lopata et al. |
| 6,888,714 | B2 |   | 5/2005 | Shaw et al. |
| 6,920,051 | B2 |   | 7/2005 | Figueroa et al. |
| 7,262,951 | B2 | * | 8/2007 | Hou et al. .................. 361/306.2 |
| 7,361,975 | B2 |   | 4/2008 | Ushiyama et al. |
| 2004/0201062 | A1 |   | 10/2004 | Hirose et al. |

* cited by examiner

*Primary Examiner* — Phat X Cao
(74) *Attorney, Agent, or Firm* — Duane Morris LLP

(57) ABSTRACT

A de-coupling capacitor module using dummy conductive elements in an integrated circuit is disclosed. The de-coupling module comprises at least one circuit module having one or more active nodes, and at least one dummy conductive element unconnected to any active node, and separated from a high voltage conductor or a low voltage conductor by an insulation region to provide a de-coupling capacitance.

20 Claims, 3 Drawing Sheets

DE-COUPLING CAPACITORS PRODUCED BY UTILIZING DUMMY CONDUCTIVE STRUCTURES INTEGRATED CIRCUITS

This application is a divisional of U.S. patent application Ser. No. 11/650,028 filed Jan. 5, 2007, which is a divisional of U.S. patent application Ser. No. 10/952,259 filed Sep. 27, 2004, both of which are expressly incorporated by reference herein in their entireties.

FIELD OF THE INVENTION

The present invention relates generally to integrated circuits (IC), and more particularly to the reduction of IC power noise generation through the utilization of dummy conductor configurations to increase the de-coupling capacitance within the IC.

BACKGROUND

Capacitors are a class of passive electronic elements useful for reduction of unwanted noise, for coupling of AC signals, and for constructing timing and phase shift networks. They are relatively bulky devices that store energy in electrostatic fields. The microscopic dimensions of today's ICs preclude the fabrication of more than a few hundred pico-farads of capacitance in an IC. Since conventional IC capacitor construction techniques limit an IC to a few hundred pico-farads, larger capacitors must reside off-chip (located on the associated printed circuit board). These off-chip capacitors are bulky and require significant PCB board space as well as additional material and processing costs. Also, due to their increased distance from the noise generating point within the IC, these off-chip capacitors are not as effective in IC noise reduction as the internal capacitors.

All of the capacitors used in ICs are of the sort called "parallel plate" capacitors, which consist of two conductive plates called "electrodes" attached to either side of a slab of insulating material typically known as dielectric. In the simple parallel-plate capacitor, the two electrodes are assumed to have the same dimensions and to reside directly opposite from one another. The value of the simple parallel-plate capacitor can be computed using the following approximate equation:

$$C = 0.0885 A(e_r)/t$$

where C is the capacitance in pico-farads, A is the area of either electrode in square microns (um$^2$), t is the thickness of the dielectric in Angstroms, and $e_r$ is a dimensionless constant called the "relative permittivity."

$e_r$ depends upon the nature of the dielectric and is sometimes called the "dielectric constant." Consider a capacitor with a plate area of 0.1 mm$^2$ constructed using a 200 A dry oxide film. If the dielectric permittivity is 4, then the capacitance will be approximately 180 pico-farads. This example explains why it is difficult to obtain internal capacitors of more than a few hundred pico-farads. As the IC geometries delve into the sub-micron level, internal IC capacitance will continue to decrease. Reducing the thickness of the dielectric increases the capacitance, but also increases the electric field across the dielectric. If the electric field increases beyond a certain point, a catastrophic short circuit of the capacitor is possible.

Current ICs have two typical capacitor types, either MOS capacitors or poly-poly capacitors. MOS capacitors consist of a thin layer of grown oxide formed on a silicon diffusion that serves as one of the electrodes. The other electrode consists of either metal or doped polysilicon. If the gate oxide is used to form a MOS capacitor, the resulting structure is called a "gate oxide capacitor".

MOS capacitors have a number of disadvantages. These MOS capacitors are designed into the IC to provide as much de-coupling capacitance as possible to minimize IC internal noise generation. It utilizes unused areas within the IC. However, these devices require a large amount of chip area (typically 10-15% of chip area) that could have been used for additional circuitry or for a higher density of IC devices per wafer. Also, MOS devices have an inherently large device leakage current through the thinner gate oxide, especially for 90-nanometer and smaller IC geometries. This leakage current causes excessive power dissipation within the IC in both static and dynamic states. Also, because of the thin gate oxide layer in MOS devices, these devices are more susceptible to electro-static discharge (ESD) anomalies.

Poly-poly capacitors employ two polysilicon electrodes in combination with either an oxide or oxide-nitride-oxide (ONO) dielectric. Many CMOS and Bi-CMOS processes already incorporate multiple polysilicon layers, so poly-poly capacitors do not necessarily require any additional masking steps. Poly-poly capacitors normally reside over field oxide. Oxide steps should not intersect the structure because they can cause surface irregularities in the lower capacitor electrode.

Both the MOS capacitor and the poly-poly capacitor structures are considered thin-film capacitors. The microscopic dimensions of today's integrated circuits preclude the fabrication of more than a few hundred pico-farads of capacitance in an IC using either the MOS or poly-ploy capacitors.

Desirable in the art of IC design are additional circuits to reduce IC power system internal power noise generation by increasing the internal IC de-coupling capacitance between the IC power and ground.

SUMMARY

In view of the foregoing, this invention provides a de-coupling capacitor module using dummy conductive elements in an integrated circuit and the method for forming the same. The de-coupling module comprises at least one circuit module having one or more active nodes, and at least one dummy conductive element unconnected to any active node, and separated from a high voltage conductor or a low voltage conductor by an insulation region to provide a de-coupling capacitance.

Although the invention is illustrated and described herein as embodied in circuits and methods to reduce IC power noise generation through the incorporation of additional internal IC de-coupling capacitance, it is nevertheless not intended to be limited to the details shown, since various modifications and structural changes may be made therein without departing from the spirit of the invention and within the scope and range of equivalents of the claims.

DESCRIPTION

The present invention provides a de-coupling system to reduce IC internal power noise generation and static/dynamic IR-drop. The de-coupling system adds internal IC de-coupling capacitance between a high voltage conductor, such as a power line, and a low voltage conductor, such as a grounded line. The de-coupling system can be implemented by utilization of "line style" and "square style" dummy conductive elements in the same or different layers within the IC. The incorporation of these two styles can be easily identifiable from the IC layout.

Figure 1:
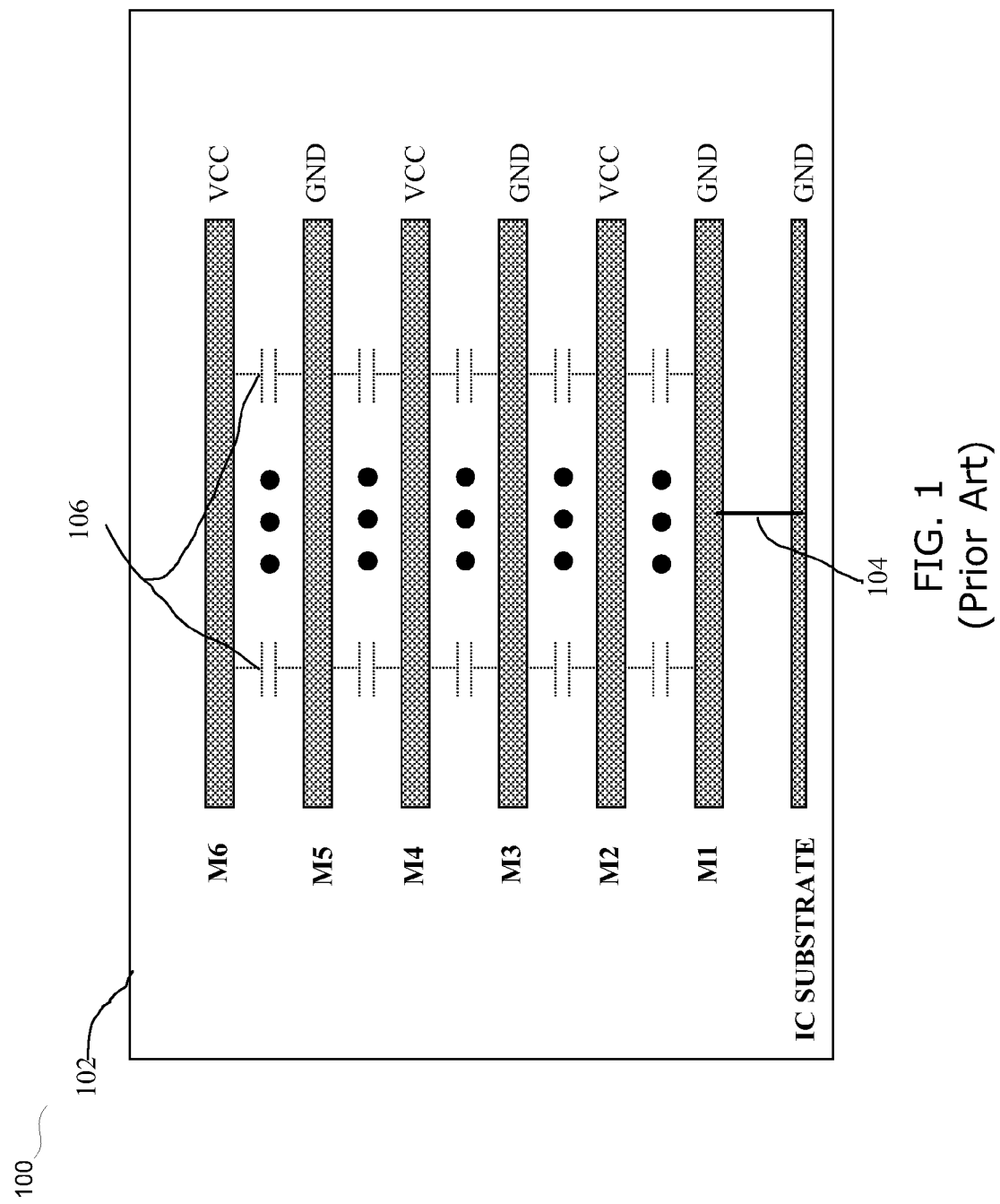
FIG. 1 presents a conventional IC interleaved metal layer structure.

FIG. 1 presents a conventional IC interleaved metal layer structure 100. A box 102 shows a lateral view of an IC with six metal layers (M1-M6) and an IC substrate layer. The first metal layer M1 is a ground layer and is tied directly to the IC substrate by a contact 104. Both the substrate layer and the M1 layer are tied to ground, as represented by the label GND. In a typical interleaved layer structure, each subsequent vertical metal layer (M1 through M6) alternates between ground or VCC (as shown in the box 102) to take advantage of a plurality of intrinsic capacitances 106 generated between the various metal layers. The GND layers (M1, M3 and M5) are tied to IC GND, while the VCC layers (M2, M4 and M6) are tied to VCC via connections between layers. The intrinsic capacitances 106 in effect act as a system of parallel de-coupling capacitances and are useful for internal power noise reduction. The intrinsic capacitances 106 add to the MOS and poly-poly capacitance that is already designed into the IC for de-coupling. The total capacitance, or the aggregate capacitance of the intrinsic capacitances 106, varies, however, by the extent of the metal on each layer as well as by the physical distance between the layers.

Figure 2:
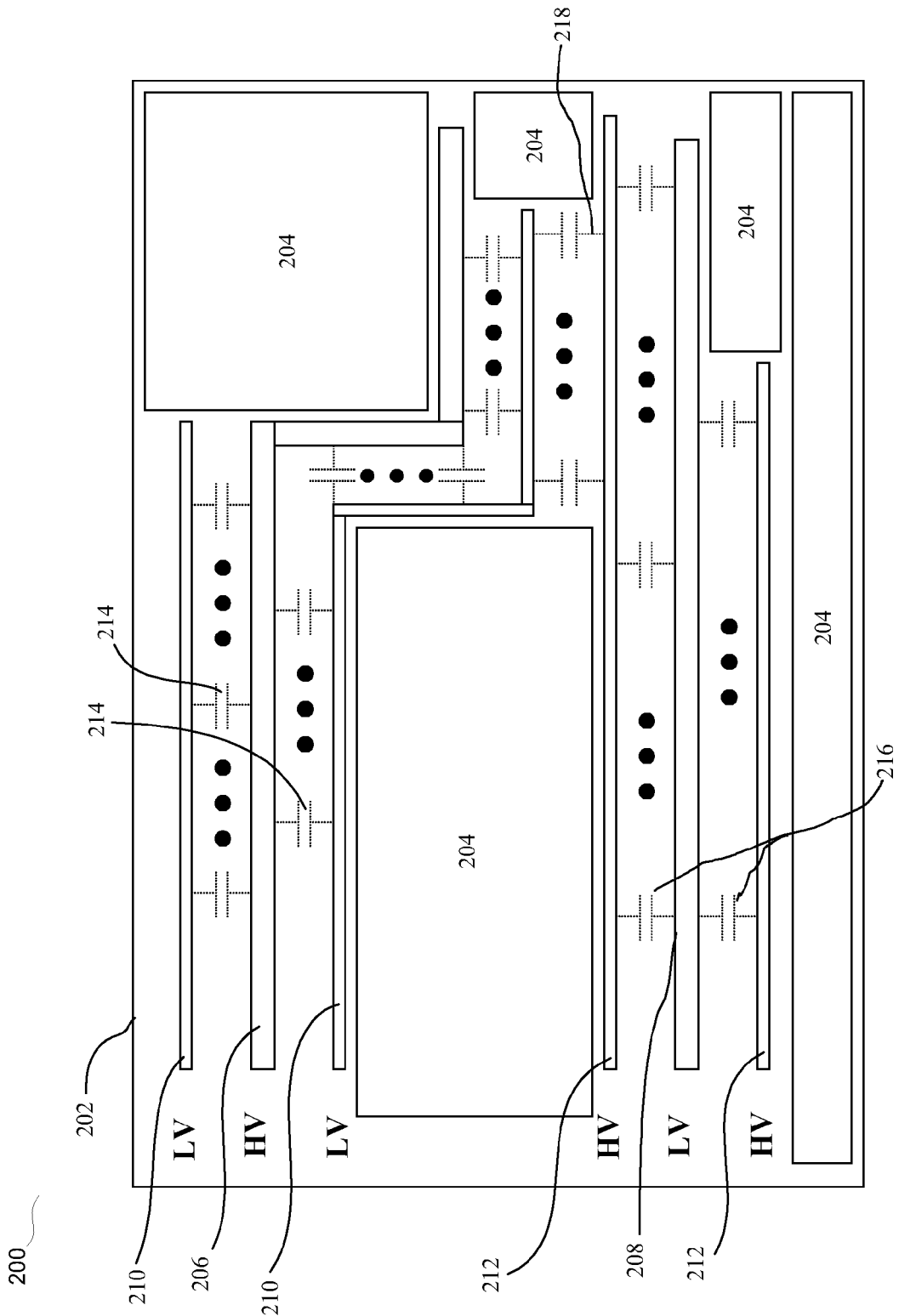
FIG. 2 illustrates a dummy conductor structure that adds additional IC de-coupling capacitance in accordance with one embodiment of the present invention.

FIG. 2 illustrates the new "line style" dummy conductive element that adds additional de-coupling capacitance to an IC in accordance with one embodiment of the present invention. The drawing 200 represents a section of an IC utilizing the "line style" dummy conductive elements for additional de-coupling capacitance. Capacitance formed in this configuration is called "Metal on Metal" (MoM) capacitance. Box 202 shows the boundaries of this section of the IC with its various circuit modules 204, a high voltage conductor 206, such as a power line, a low voltage conductor 208, such as a grounded line, and dummy conductor elements 210 and 212, such as metal lines and doped polysilicon lines. The high voltage conductor 206, low voltage conductor 208, and the components within the circuit modules 204 are connected to at least one active node that interconnects them for a normal operation.

The dummy conductive elements 210 and 212 are connected to a voltage different from its neighboring high voltage conductor 206 or the low voltage conductor 208, and are separated therefrom by an insulation region. For example, the de-coupling capacitance is formed by running the grounded dummy conductive elements 210 adjacent to the high voltage conductor 206, such as a Vcc power line, or running VCC connected dummy conductive elements 212 adjacent to the low voltage conductor 208, such as a ground line. These dummy conductive elements 210 and 212 are not connected to any active node within the IC circuit other than its connection to ground or VCC for the creation of the de-coupling capacitance, and they are appropriately named "dummy conductive element." For the purpose of this invention, the term "active node" refers to nodes in an active circuit module that are not connected to any power supply. These dummy conductive elements can be routed throughout the layer next to VCC or GND lines wherever an unused area exists. It can also be routed around circuit modules 204 if required. The de-coupling capacitance 214 is formed by the parallel routing of the dummy conductive elements 210 close to the high voltage conductor 206. The maximum de-coupling capacitance 214 is created by routing the maximum parallel length between these lines. The de-coupling capacitance 216 is also formed by the parallel routing of the VCC connected dummy conductive elements 212 close to the low voltage conductors 208. As before, the maximum de-coupling capacitance 216 is created by routing the maximum parallel routing length between these lines. Additional de-coupling capacitance 218 may be formed where the grounded dummy conductive elements 210 parallel other VCC connected dummy conductive elements 212. The goal of adding de-coupling capacitance for IC power noise reduction is to create the maximum de-coupling capacitance possible rather than a specific capacitance value. The capacitance generated can be optimized by the selection of the proper line width, spacing between lines, and length of the parallel routing.

The "line style" dummy conductive structure has a number of advantages. For example, it has no leakage current to increase the IC power dissipation. It occupies only unused chip area which will not affect the product yield. Further, no circuit design changes are needed, and finally the layer layout may be changed to add the dummy lines using standard EDA tools.

In addition to the "line style" dummy conductive structures, a "square style" dummy metal structure also helps to optimize the de-coupling capacitance by utilizing large portions of the unused chip area, as will be explained below.

Figure 3:
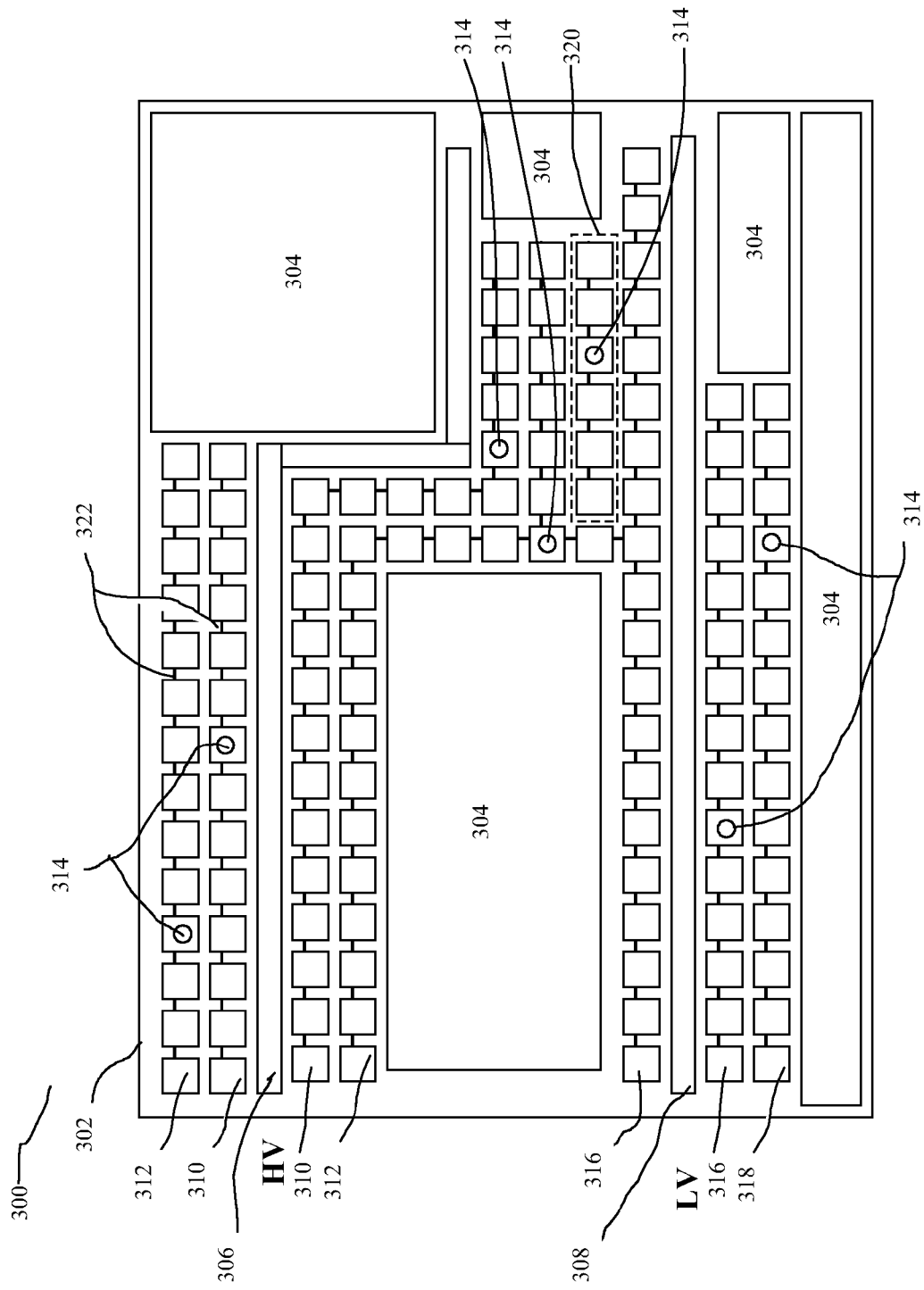
FIG. 3 illustrates a dummy conductor structure that adds additional IC de-coupling capacitance in accordance with another embodiment of the present invention.

FIG. 3 illustrates the "square style" dummy conductive structure that adds additional IC de-coupling capacitance in accordance with a second embodiment of the present invention. A section 300 of an IC is shown utilizing the "square style" dummy conductive structure for additional de-coupling capacitance. The box 302 shows one layer of this IC with its various circuit modules 304, a high voltage conductor 306, such as VCC power line, a low voltage conductor, such as ground line 308, grounded dummy conductive units (310, 318 and 320) and VCC dummy conductive units (312 and 316). The dummy conductive units are interconnected by lines 322 to form high or low voltage strips, such as VCC or GND strips, that form intrinsic capacitors between the units and the high voltage or low voltage conductors, as well as between the units themselves. The advantage of this square dummy conductive structure is that all unused chip areas may be utilized to increase the de-coupling capacitance by stacking the units as required to obtain inter-unit capacitance as well as the capacitance to the high or low voltage conductors. Note that a strip 320 of six dummy conductive units is not adjacent to either the high voltage conductor or the low voltage conductor. In other words, the strip 320 provides inter-unit capacitance to the strips placed in a layer that is immediately adjacent to, either above and/or below, the current layer. This provides additional de-coupling capacitance that would otherwise be unused. Each of these strips of units are connected to other IC layers of either ground or VCC by interconnections 314 that translate from one layer to another providing interconnections of signals, VCC and GND. When inter-layer arrangements are made to form decoupling capacitance, a predetermined "location" system may be used to assure that the metal structures, either the metal lines or metal squares, stack up to have vertical overlaps. For example, a gradient or coordinate system can be implemented to arrange the metal structures.

The goal of adding de-coupling capacitance for IC power noise reduction is to create the maximum de-coupling capacitance possible rather than a specific capacitance value. The capacitance generated can be optimized by the selection of the proper unit width, spacing between units, length of the connected strips and the inter-unit capacitance. Note that while units are shaped in squares in FIG. 3, they may be other shapes, such as triangles, rectangles, polygons, circles, and ovals.

This "square style" dummy metal structure has a number of advantages. For example, the structure has no leakage current to increase the IC power dissipation. It occupies only unused chip areas which will not affect the product yield, and covers a relatively large area to increase the capacitance. Further, no circuit design changes are needed, and finally, the layer layout may be changed to add the dummy square using standard EDA tools.

When placing the dummy metal structures in a circuit for forming decoupling capacitors, one or more active nodes of an active circuit module are first formed. For example, elements for active or functional circuit modules such as input/output circuit modules are placed first. The active circuit modules have one or more active nodes that need to be routed by conductive materials such as metal lines to make the module functional. When the locations for these modules are identified, one or more metal structures, whether of the "line style" or "square style," are placed in one or more unused areas. These metal structures are not connected to any active node of the active circuit module. The routing of the active nodes of the circuit module can happen before or simultaneously with the placement of the dummy metal structures. Depending on the design, the metal structures can be formed on the same layer as well as different layers as described above. Since the dummy metal structures are used for de-coupling purposes, one or more contacts are placed to connect one or more metal structures to either a power supply voltage level or a ground level. Since the de-coupling capacitors will have an impact on the timing performance of the active circuit modules, initially adjusting a timing configuration of the active circuit module is necessary before the de-coupling capacitors are formed. Once all the decoupling capacitors are formed by the dummy metal structures, re-adjusting timing configuration of the active circuit module is necessary.

In addition to various functional advantages that the de-coupling capacitors made of dummy conductive structures or elements can provide, it is understood that dummy metals are placed in the circuit in a conventional process for simply occupying the unused areas. The present invention turns a wasted resource into use without adding much processing overhead, thus providing a very economical solution for reducing internal power noise and solving IR issues.

The above invention provides many different embodiments or examples for implementing different features of the invention. Specific examples of components and processes are described to help clarify the invention. These are, of course, merely examples and are not intended to limit the invention from that described in the claims.

Although illustrative embodiments of the invention have been shown and described, other modifications, changes, and substitutions are intended in the foregoing invention. Accordingly, it is appropriate that the appended claims be construed broadly and in a manner consistent with the scope of the invention, as set forth in the following claims.

What is claimed is:

1. A de-coupling capacitor module in an integrated circuit comprising:
   a plurality of circuit modules having one or more active nodes;
   a plurality of dummy conductive elements unconnected to any active node;
   a high voltage conductor between two of the dummy conductive elements which have a voltage lower than the high voltage conductor, the high voltage conductor separated by an insulation region from each of the two dummy conductive elements to provide a first de-coupling capacitance; and
   a low voltage conductor between another two of the dummy conductive elements having a voltage higher than the low voltage conductor and separated by a further insulation region from each of the other two dummy conductive elements to provide a second de-coupling capacitance,
   wherein the dummy conductive elements are substantially parallel among themselves, the dummy conductive elements being located outside of an area occupied by the circuit modules, so that none of the dummy conductive elements overlie or underlie any of the circuit modules having active nodes.

2. The de-coupling module of claim 1 wherein the high voltage conductor, the low voltage conductor, and the dummy conductive elements are formed on the same metal layer of the integrated circuit.

3. The de-coupling module of claim 1 wherein the high voltage conductor, the low voltage conductor, and the dummy conductive elements are formed on two or more different metal layers of the integrated circuit.

4. The de-coupling module of claim 1 wherein one of the dummy conductive elements is connected to a voltage different from that of either the high or low voltage conductor that is immediately adjacent to it for providing a de-coupling capacitance.

5. The de-coupling module of claim 1 wherein the dummy conductive elements are located in an area unoccupied by any of the active nodes.

6. The de-coupling module of claim 1, wherein the dummy conductive elements include three elongated elements parallel and adjacent to three respective sides of at least one of the circuit modules.

7. The de-coupling module of claim 1 wherein the dummy conductive elements include two elongated elements connected to each other and parallel and adjacent to two respective adjacent sides of at least one of the circuit modules.

8. The de-coupling module of claim 1 wherein the dummy conductive elements include two elongated dummy conductive elements parallel and adjacent to the same high voltage conductor or low voltage conductor, on opposite sides thereof.

9. The de-coupling module of claim 1 wherein the dummy conductive element includes:
   first and second elongated dummy conductive elements parallel and adjacent to the same high voltage conductor, on opposite sides thereof; and
   third and fourth elongated dummy conductive elements parallel and adjacent to the same low voltage conductor, on opposite sides thereof.

10. The de-coupling module of claim 9 wherein the first and second elongated dummy conductive elements and the high voltage conductor therebetween are located on a first side of at least one of the circuit modules, and the third and fourth elongated dummy conductive elements and the low voltage conductor therebetween are located on a second side of the at least one circuit module, the second side being opposite the first side.

11. The de-coupling module of claim 10 wherein the first, second, third and fourth dummy conductive elements are formed on the same metal layer.

12. The de-coupling module of claim 1 wherein the high voltage conductor, the low voltage conductor, and the dummy conductive elements are formed on the same metal layer as a layer of one of the circuit modules.

13. A de-coupling capacitor module in an integrated circuit comprising:
- a plurality of circuit modules having one or more active nodes;
- one or more dummy conductive elements unconnected to any active node; and
- one or more high voltage conductor or a low voltage conductor separated by an insulation region from at least one of the dummy conductive elements to provide a de-coupling capacitance,
- wherein the dummy conductive elements are substantially parallel among themselves and located in an area unoccupied by any of the circuit modules, the dummy conductive elements being located outside of an area occupied by the circuit modules, so that none of the dummy conductive elements overlie or underlie any of the circuit modules having active nodes;
- wherein the one or more dummy conductive elements include two elongated dummy conductive elements parallel and adjacent to the same high voltage conductor or low voltage conductor, on opposite sides thereof;
- wherein the two elongated dummy conductive elements and the high voltage conductor or low voltage conductor are formed on the same metal layer of the integrated circuit.

14. A de-coupling capacitor module in an integrated circuit comprising:
- a plurality of circuit modules having one or more active nodes;
- a plurality of dummy conductive elements unconnected to any active node; and
- one or more high voltage conductor or a low voltage conductor separated by an insulation region from at least one of the dummy conductive elements to provide a de-coupling capacitance,
- wherein the dummy conductive elements are substantially parallel among themselves and located in an area unoccupied by any of the circuit modules, so that none of the dummy conductive elements overlie or underlie any of the circuit modules having active nodes, and
- the high voltage conductor, low voltage conductor and dummy conductive elements are arranged in a set such that a voltage of each successive member of the set alternates between a high voltage and a low voltage.

15. The de-coupling module of claim 14 wherein the high voltage conductor, the low voltage conductor, the dummy conductive elements and the circuit module are formed on the same metal layer of the integrated circuit.

16. The de-coupling module of claim 14, wherein the dummy conductive elements include three elongated elements parallel and adjacent to three respective sides of the at least one circuit module.

17. The de-coupling module of claim 14 wherein the dummy conductive elements include two elongated elements connected to each other and parallel and adjacent to two respective adjacent sides of the at least one circuit module.

18. The de-coupling module of claim 14 wherein the dummy conductive elements include two elongated dummy conductive elements parallel and adjacent to the same high voltage conductor or low voltage conductor, on opposite sides thereof.

19. The de-coupling module of claim 18
- wherein the two elongated dummy conductive elements and the high voltage conductor or low voltage conductor are formed on the same metal layer of the integrated circuit.

20. The de-coupling module of claim 14 wherein the dummy conductive element includes:
- first and second elongated dummy conductive elements parallel and adjacent to the same high voltage conductor, on opposite sides thereof; and
- third and fourth elongated dummy conductive elements parallel and adjacent to the same low voltage conductor, on opposite sides thereof.

* * * * *